(12) United States Patent
Chen et al.

(10) Patent No.: US 9,112,351 B2
(45) Date of Patent: Aug. 18, 2015

(54) ELECTROSTATIC DISCHARGE CIRCUIT

(71) Applicants: Wen-Yi Chen, Chandler, AZ (US); Chai Ean Gill, Chandler, AZ (US)

(72) Inventors: Wen-Yi Chen, Chandler, AZ (US); Chai Ean Gill, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 226 days.

(21) Appl. No.: 13/759,241

(22) Filed: Feb. 5, 2013

(65) Prior Publication Data

US 2014/0218829 A1 Aug. 7, 2014

(51) Int. Cl.
*H02H 9/04* (2006.01)
*H01L 27/02* (2006.01)

(52) U.S. Cl.
CPC ........... *H02H 9/046* (2013.01); *H01L 27/0285* (2013.01)

(58) Field of Classification Search
CPC ..... H02H 9/044; H02H 9/046; H01L 27/0285
USPC ....................................................... 361/56
See application file for complete search history.

(56) References Cited

U.S. PATENT DOCUMENTS

| | | | |
|---|---|---|---|
| 6,912,109 B1 * | 6/2005 | Ker et al. | 361/56 |
| 6,919,602 B2 | 7/2005 | Lin et al. | |
| 7,027,276 B2 | 4/2006 | Chen | |
| 7,283,342 B1 | 10/2007 | Ker et al. | |
| 7,423,855 B2 * | 9/2008 | Fankhauser et al. | 361/56 |
| 7,586,721 B2 * | 9/2009 | Wang et al. | 361/56 |
| 8,179,647 B2 * | 5/2012 | Chu et al. | 361/56 |
| 2005/0200396 A1 * | 9/2005 | Hsu et al. | 327/313 |
| 2012/0180008 A1 * | 7/2012 | Gist et al. | 716/101 |

* cited by examiner

*Primary Examiner* — Thienvu Tran
*Assistant Examiner* — Kevin J Comber
(74) *Attorney, Agent, or Firm* — Ingrassia Fisher & Lorenz, P.C.

(57) ABSTRACT

An integrated circuit is provided. The integrated circuit may include, but is not limited to, a first node, a second node configured to be coupled to ground, an output driver, and a electrostatic discharge circuit electrically coupled to the first node, the second node, and the output driver. The electrostatic discharge circuit may include, but is not limited a high-pass filter configured to detect an electrostatic discharge event at the first node, a driving stage circuit electrically coupled to the high-pass filter and the output driver, the driving stage circuit configured to receive a signal from the high-pass filter when the high-pass filter detects the electrostatic discharge event and further configured to shunt an input of the output driver to the second node in response to the signal from the high-pass filter, and a step-down circuit electrically coupled to the driving stage circuit and configured to bias the driving stage circuit.

16 Claims, 5 Drawing Sheets

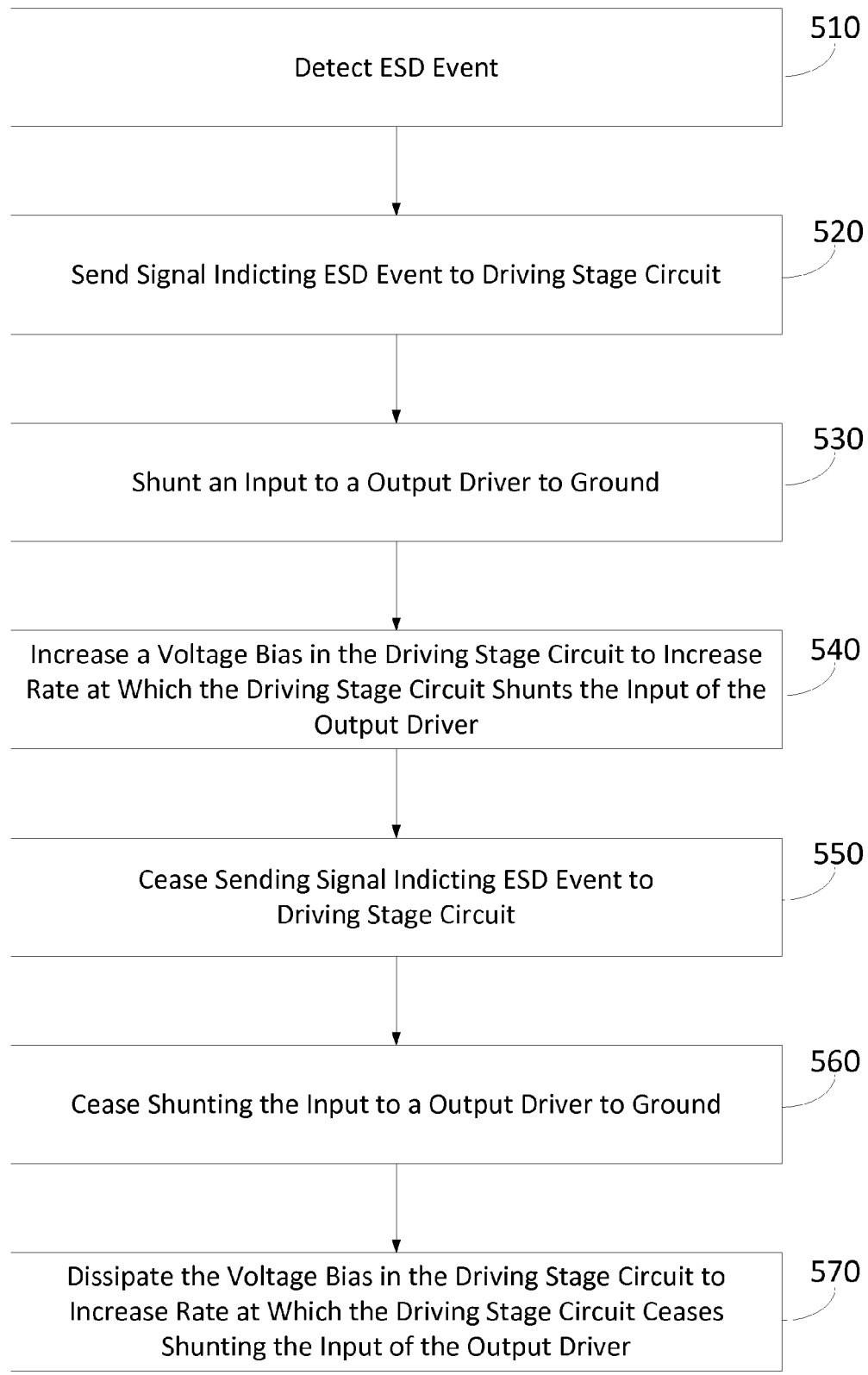

ELECTROSTATIC DISCHARGE CIRCUIT

TECHNICAL FIELD

The following relates to circuits, and more particularly to an electrostatic discharge circuit for providing electrostatic discharge protection.

BACKGROUND

Integrated circuits are present in virtually all electronic equipment today. Integrated circuits can be found, for example, in vehicles, computers, mobile phones, home appliances and any other consumer or commercial electronic device. Integrated circuits, however, can be sensitive to electrostatic discharges. In some instances, an electrostatic discharge can cause severe damage to the integrated circuit, disabling the electronic equipment.

DESCRIPTION OF THE DRAWING FIGURES

Exemplary embodiments will hereinafter be described in conjunction with the following drawing figures, wherein like numerals denote like elements.

FIG. 5 is a flow diagram illustrating a method for operating an ESD circuit, in accordance with an embodiment.

DETAILED DESCRIPTION

According to various exemplary embodiments, an electrostatic discharge (ESD) circuit for an integrated circuit is provided. The ESD circuit provides electrostatic discharge protection for the integrated circuit. While the drawings and the detailed description discuss a ESD circuit in the context of an integrated circuit, the ESD circuit can be used in any circuit subject to electrostatic discharge. Furthermore, the ESD circuit could also provide protection for integrated circuits while the circuit is still on a wafer.

Figure 1:
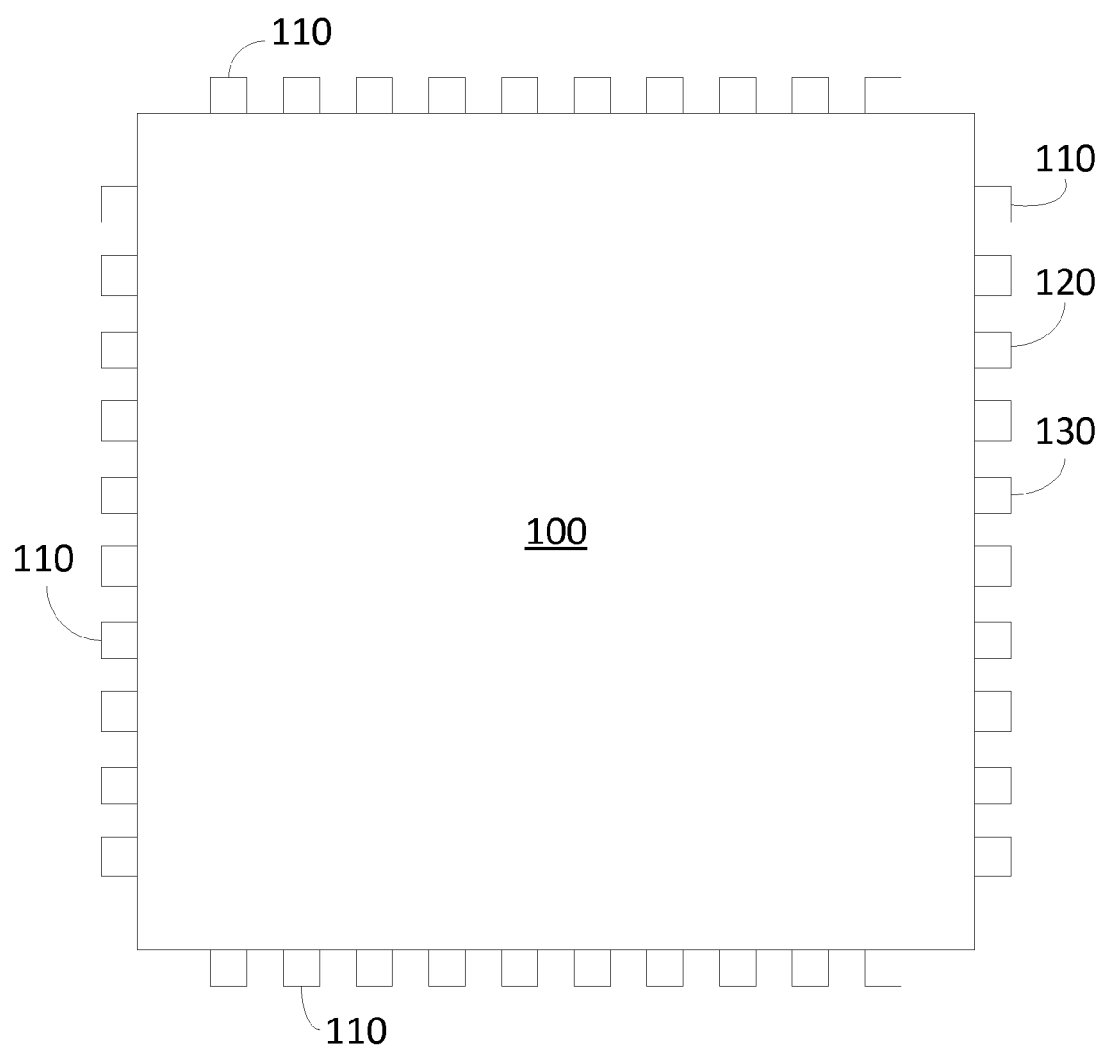
FIG. 1 illustrates an exemplary packaged integrated circuit (IC), in accordance with an embodiment.

FIG. 1 illustrates an exemplary packaged integrated circuit (IC) 100, in accordance with an embodiment. The IC 100 may be a central processing unit (CPU), an application specific integrated circuit (ASIC), a field programmable gate array (FPGA), a programmable logic controller (PLC), a microcontroller, a graphics processing unit (GPU), a physics processing unit (PPU), a digital signal processor (DSP), an analog circuit, a sensor, or any other type of circuitry. The IC 100 includes a number of either output or input/output (I/O) external connectors 110 (both of which are herein after referred to as I/O external connectors). The number and layout of the I/O external connectors 110 can vary depending upon the type of IC. The I/O external connectors 110 may be used for receiving an input signal and/or providing an output signal. The purpose of the I/O external connectors can vary greatly depending upon the purpose of the IC 100. The IC further includes at least one external connector 120 for coupling to a first reference voltage and at least one external connector 130 for coupling to a second reference voltage or ground reference.

The I/O external connectors 110 may be subject to an ESD. An ESD is the sudden flow of electricity between two objects typically caused by contact, an electrical short, or dielectric breakdown. However, an ESD can also be caused by a buildup of static electricity by tribocharging, or by electrostatic induction or from a variety of other sources. The IC 100 could potentially be damaged by the ESD. Accordingly, the IC 100 is provided with a ESD circuit configured to protect an output driver, as discussed in further detail below.

Figure 2:
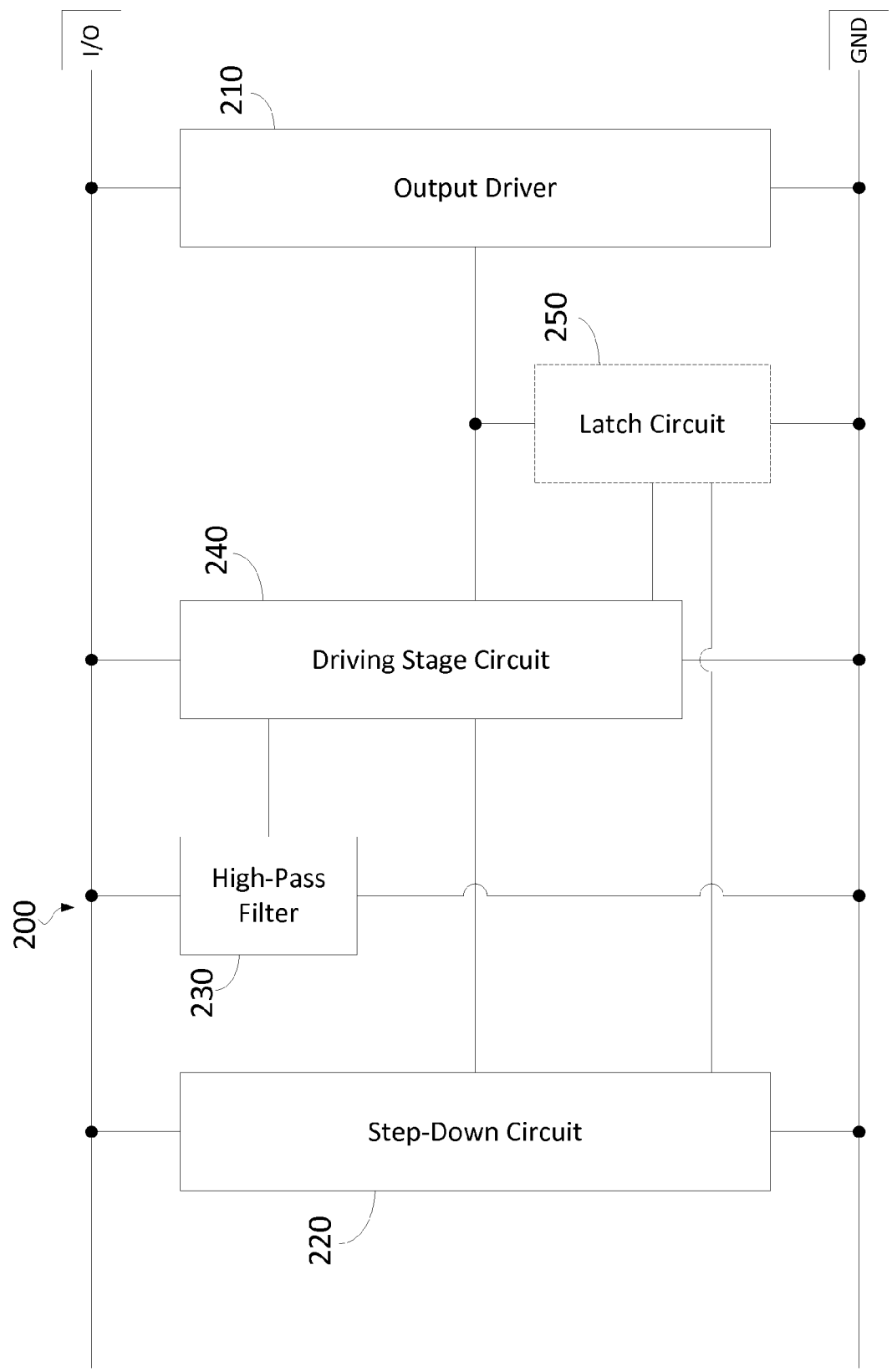
FIG. 2 is a block diagram illustrating an ESD circuit configured to protect an output driver, in accordance with an embodiment.

FIG. 2 is a block diagram illustrating an ESD circuit 200 configured to protect an output driver 210, in accordance with an embodiment. The output driver 210 may be any circuit which aids in the transmission of signals. The ESD circuit may be on an integrated circuit itself, or coupled between the integrated circuit and the packaging of the integrated circuit. In one embodiment, for example, each I/O node may have its own ESD circuit 200. In another embodiment, for example, each ESD circuit 200 may be coupled to one or more I/O nodes in the circuit. In one embodiment, for example, the ESD circuit includes a step-down circuit 220. The step-down circuit 220 provides a bias voltage for other elements in the ESD circuit 200, as discussed in further detail below. In one embodiment, for example, the step-down circuit 220 may be a voltage divider circuit. The voltage divider circuit could, for example, include a number of resistors arranged in series. The number of resistors and the value of the resistors can vary depending upon the bias voltage needed by the components of the ESD circuit 200. In other embodiments, for example, the voltage divider circuit could be a low-pass RC filter, an inductive divider, a capacitive divider or any other type of voltage divider circuit. In other embodiments, for example, the step-down circuit could include a diode-connected NMOS or PMOS string (a string of NMOS or PMOS with their gates individually connected to their own drain). In yet other embodiments, for example, the step-down circuit 220 may be a buck converter or any other circuit capable of stepping down a voltage.

The ESD circuit 200 also includes a high-pass filter 230. The high-pass filter 230 is coupled to an I/O node, such as the external connector 110 illustrated in FIG. 1, and is configured to detect an ESD event at the I/O node. In one embodiment, for example, the high-pass filter 230 may include a capacitor and a transistor, as discussed in further detail below. In other embodiments, for example, the high-pass filter 230 may include a capacitor and a resistor, or a resistor and an inductor. Upon detection of an ESD event at the I/O node, the high-pass filter 230 sends a signal to a driving stage circuit 240. Upon receipt of the signal from the high-pass filter 230, the driving stage circuit 240 pulls the I/O node low to protect the IC 100 from the ESD event, as discussed in further detail below.

In one embodiment, for example, the ESD circuit may also include a latch circuit 250. The latch circuit 250 increases that rate at which the ESD circuit shunts the input of the output driver 210 to protect the output driver 210 during an ESD event relative to an embodiment which does not include the latch circuit. The latch circuit 250 can also increase the rate at which the IC 100 returns to normal operation, as discussed in further detail below.

Figure 3:
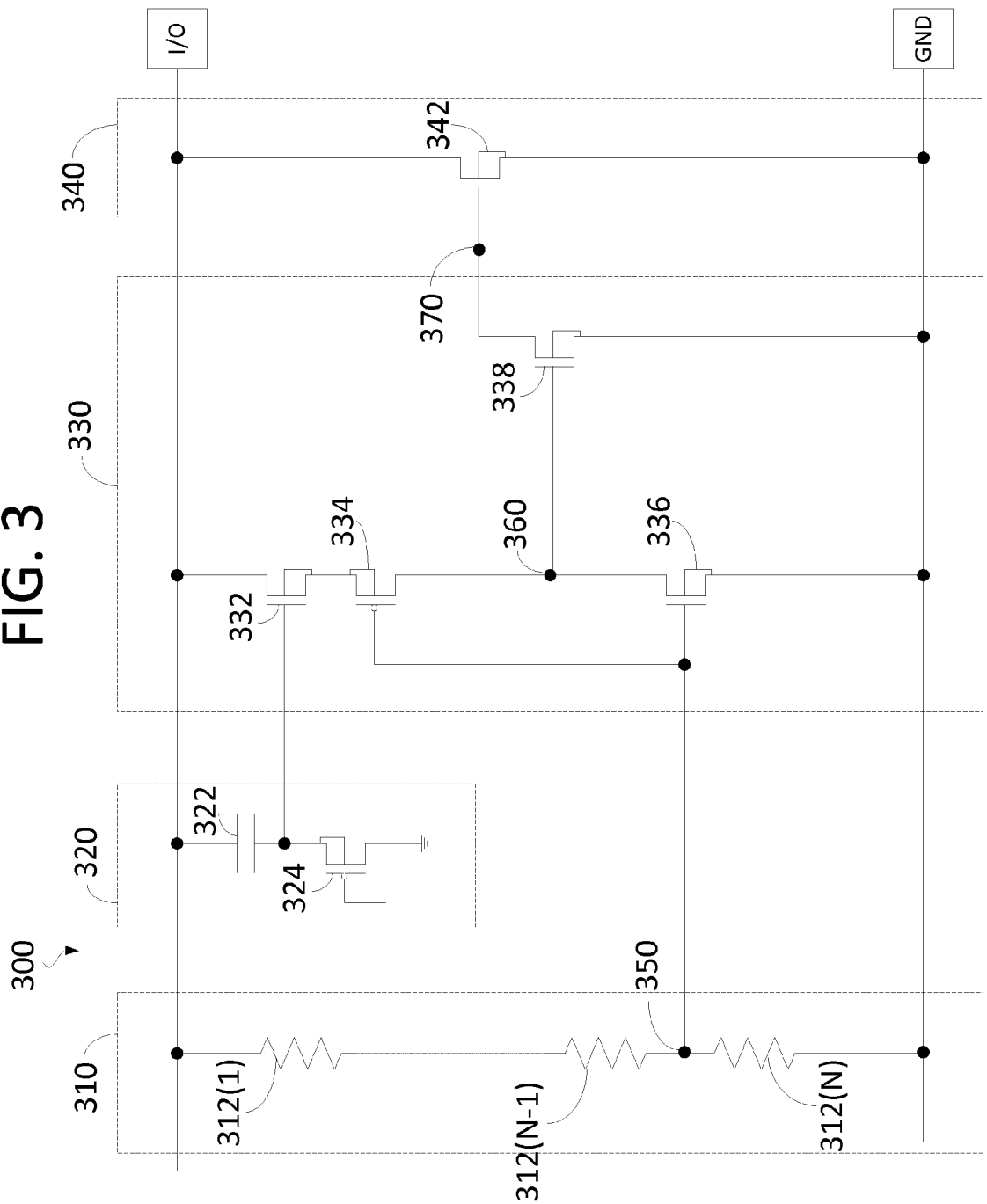
FIG. 3 is a circuit level diagram illustrating an exemplary ESD circuit, in accordance with an embodiment.

FIG. 3 is a circuit level diagram illustrating an exemplary ESD circuit 300, in accordance with an embodiment. The ESD circuit 300 includes a step-down circuit 310, a high-pass filter 320, and a driving stage circuit 330. The output of the ESD circuit 300 is coupled to an output driver 340.

The step-down circuit 310 includes a series of resistors 312(1) to 312(N) arranged as a voltage divider. The step-down circuit 310 outputs a bias voltage at a node 350 which is electrically coupled to the driving stage circuit 330, as discussed in further detail below. The value of the resistors 312(1) to 312(N) and the output bias voltage can vary depending upon the number of resistors used and the needs of the system. In one embodiment, for example, a total resistance in the kilo ohm range may be desired to suppress the DC current consumption of the voltage divider. The resistor 312(1) is electrically coupled to the I/O node (Labeled I/O in FIG. 3). The resistor 312(N) is electrically coupled to the I/O node configured to be coupled to ground or another secondary reference voltage (labeled GND in FIG. 3 and hereinafter referred to as ground).

The high-pass filter 320 includes a capacitor 322 coupled to the I/O node. When the I/O node experiences an ESD event, the capacitor couples the I/O node to the driving stage circuit 330, as discussed in further detail below. The high-pass filter 320 further includes a transistor 324 coupled between the capacitor and ground. In one embodiment, for example, the transistor 324 may be a high-voltage metal oxide semiconductor field-effect transistor (HV MOSFET). In one embodiment, for example, the I/O voltage at the I/O node could be forty volts or higher. Accordingly, in these instances, HV MOSFETs may be needed to sustain the 40-V input voltage at the I/O node. The transistor 324 acts similar to a resistor, affecting the frequency of the signal which passes through the high-pass filter 320 along with the capacitor 322. In other words, the size of the capacitor 322 and the resistance provided by the transistor 324 affect what signals can pass through the high-pass filter. ESD events occur at a high frequency, having a rise time around the order of nanoseconds (10 ns is a typical estimation for the rise time of an ESD discharge), and, as such, would pass through the high-pass filter. In contrast, input or output at the I/O node would generally be at a lower frequency (since the rise time of an ESD event is ~10 ns, the time constant of the high pass filter can be designed at, for example, 100 ns. A normal circuit operating signal with 1 μs rise time will then be filtered out by the high pass filter), and, thus, the voltage on the I/O node would not be coupled through the capacitor 322 to the driving stage circuit 330 during normal operation. In another embodiment, for example, an NMOS with its gate connected to its drain could be used rather than transistor 324. In yet another embodiment, for example, the transistor 324 may be replaced with one or more resistors.

The exemplary driving stage circuit 330 illustrated in FIG. 3 includes four transistors 332-338. In one embodiment, for example, the transistors 332-338 may be HV MOSFET. A gate of the transistor 332 is electrically coupled to the capacitor 322 in the high-pass filter 320. A drain of the transistor 332 is electrically coupled to the I/O node. A source of the transistor 332 is electrically coupled to the source of transistor 334. The gate of transistor 334 is electrically coupled to the node 350 of the step-down circuit 310. The drain of transistor 334 is electrically coupled to the drain of transistor 336 and the gate of transistor 338 at a node 360. The gate of transistor 336 is electrically coupled to the node 350 of the step-down circuit 310. The source of transistor 336 is coupled to ground. The source of the transistor 338 is also electrically coupled ground. The drain of transistor 338 is the output of the ESD circuit 300 and is electrically coupled to the output driver 340. The output of the ESD circuit is labeled as node 370.

In one embodiment, for example, the output driver 340 may include a transistor 342. The transistor 342 may be a HV MOSFET or any other type of transistor. A gate of the transistor 342 is electrically coupled to the drain of transistor 338 of the driving stage circuit 330. The drain of the transistor 342 is electrically coupled to the I/O node. The source of the transistor 342 is electrically coupled ground. (In another embodiment, for example, the output driver 340 may include two or more NMOS transistors stacked in series. In this embodiment, for example, the node 370 may be connected to one or more gate(s) of the stacked NMOS transistors.

During normal operation, when no ESD event is occurring, there should be no output from the driving stage circuit 330. Because the high-pass filter blocks non-ESD events, the voltage at the I/O gate is not coupled to the gate of transistor 332 in the driving stage circuit 330 through the capacitor 322 in the high-pass filter 320. Transistors 324, 334 and 338 would be off (i.e., not conducting) and transistor 336 would be on (i.e., conducting).

During an ESD event, the I/O node is coupled to transistor 332 through the capacitor 322. The gate-source voltage across the gate and source of transistor 332 turns transistor 332 on. Transistor 334 also turns on since the potential at node 350, caused by the voltage of the ESD event on the I/O node, causes the gate-source voltage of transistor 334 to exceed a threshold voltage of transistor 334. Transistors 332 and 334 pull node 360 high (i.e., node 360 is coupled to the I/O node through transistors 332 and 334). Once node 360 is pulled high, the gate-source voltage of transistor 338 exceeds a threshold voltage of transistor 338, turning transistor 338 on. When transistor 338 is turned on, the transistor 338 couples the output of the ESD circuit (i.e., node 370) to ground, protecting the output driver 340. In the embodiment illustrated in FIG. 3, when the node 370 is electrically coupled to ground, the gate of transistor 342 of the output driver 340 is coupled to ground. Thus, the gate and the source of the transistor 342 are coupled to ground during an ESD event causing the gate-source voltage of the transistor 342 to be substantially zero, ensuring that the transistor 342 remains off during the ESD event.

As the voltage on the I/O node subsides (because the ESD event is over), the voltage stored in the capacitor 322 begins to dissipate through the transistor 324, dropping the voltage at the gate of transistor 332 in the driving stage circuit 330. When the gate-source voltage of transistor 332 drops below the threshold voltage of transistor 332, transistor 332 turns off. Furthermore, a drop in voltage at node 350 caused when the voltage from the ESD event subsides through the step-down circuit 310, causes transistor 334 to turn off. With node 360 no longer coupled to the I/O gate through transistors 332 and 334, the potential at node 360 begins to dissipate through transistor 336 to ground, causing the gate-source voltage of transistor 338 to drop below the threshold voltage of transistor 338, thus turning off transistor 338 and turning off the driving stage circuit 330.

Figure 4:
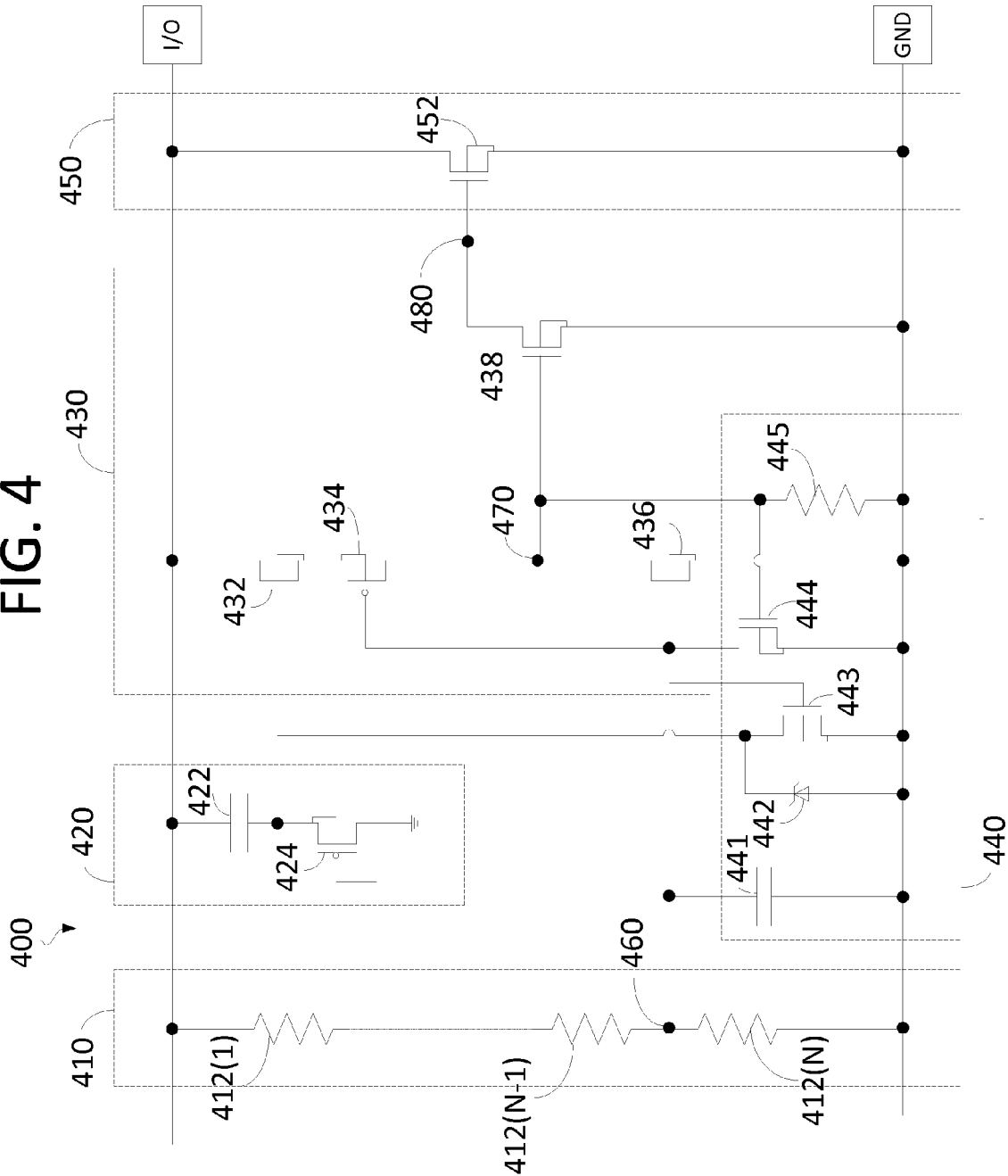
FIG. 4 is a circuit level diagram illustrating another exemplary ESD circuit, in accordance with an embodiment.

FIG. 4 is a circuit level diagram illustrating another exemplary ESD circuit 400, in accordance with an embodiment. The ESD circuit 400 includes a step-down circuit 410, a high-pass filter 420, a driving stage circuit 430, and a latch circuit 440. The output of the ESD circuit 400 is coupled to an output driver 450.

The step-down circuit 410 includes a series of resistors 412(1) to 412(N) arranged as a voltage divider. The step-down circuit 410 outputs a bias voltage at a node 460 which is electrically coupled to a driving stage circuit 430, as discussed in further detail below. As discussed above, the value of the resistors 412(1) to 412(N) and the output bias voltage can vary depending upon the needs of the IC 100. The resistor 412(1) is electrically coupled to the I/O node (Labeled I/O in FIG. 4). The resistor 412(N) is electrically coupled to the I/O node configured to be coupled to ground or another secondary reference voltage (labeled GND in FIG. 4 and hereinafter referred to as ground).

The high-pass filter 420 includes a capacitor 422 coupled to an I/O node. When the I/O node experiences an ESD event, the capacitor coupled the I/O gate to the driving stage circuit 430, as discussed in further detail below. The high-pass filter 420 further includes a transistor 424 coupled between the capacitor and ground. In one embodiment, for example, the transistor 424 may be a high-voltage metal oxide semiconductor field-effect transistor (HV MOSFET). The transistor 424 acts similar to a resistor, affecting the frequency of the signal which passes through the high-pass filter 420 along with the capacitor 422. In other words, the size of the capacitor 422 and the resistance provided by the transistor 424 affect what signals can pass through the high-pass filter. ESD events occur at a high frequency and, as such, would pass through the high-pass filter. In contrast, input or output at the I/O node would generally be at a lower frequency, and, thus, the voltage on the I/O node would not be coupled through the capacitor 422 to the driving stage circuit 430. In another embodiment, for example, the transistor 424 may be replaced with one or more resistors. A source of the transistor 424 is coupled to the latch circuit 440, as discussed in further detail below.

The exemplary driving stage circuit 430 illustrated in FIG. 4 includes four transistors 432-438. In one embodiment, for example, the transistors 432-438 may be HV MOSFET. A gate of the transistor 432 is electrically coupled to the capacitor 422 in the high-pass filter 420. A drain of the transistor 432 is electrically coupled to the I/O node. A source of the transistor 432 is electrically coupled to the source of transistor 434. The gate of transistor 434 is electrically coupled to the node 460 of the step-down circuit 410. The drain of transistor 434 is electrically coupled to the drain of transistor 436 and the gate of transistor 438 at a node 470. The gate of transistor 436 is electrically coupled to the node 460 of the step-down circuit 410. The source of transistor 436 is coupled to ground. The source of the transistor 438 is also electrically coupled ground. The drain of transistor 438 is the output of the ESD circuit 400 and is electrically coupled to the output driver 450. The output of the ESD circuit is labeled as node 480 in FIG. 4.

In one embodiment, for example, the latch circuit 440 may include a capacitor 441 coupled between the node 460 of the step-down circuit 410 the I/O node which is configured to be coupled to a ground or other secondary reference voltage. In another embodiment, for example, the capacitor 441 may be omitted, but a parasitic capacitance may still be created between the node 460 of the step-down circuit 410 and ground, as discussed in further detail below. The latch circuit 440 further includes a one or more zener diodes 442 electrically coupled between the gate of transistor 432 and ground. The one or more zener diodes 442 limit the highest potential voltage at the gate of transistor 432 to the combined breakdown voltages of the one or zener diodes 442. The number of zener diodes may vary depending upon the breakdown voltage of each zener diode 442 and the rated gate-source voltage of the transistor 432. The latch circuit 440 further includes transistors 443-444. In one embodiment, for example, the transistors 443-444 may be HV MOSFETs. A source of transistor 443 is electrically coupled to ground, a gate of transistor 443 is electrically coupled to node 460 and a drain of transistor 443 is coupled to the gate of transistor 432. A source of transistor 444 is electrically coupled to ground and a drain of gate of transistor 444 is electrically coupled to node 460. A gate of transistor 444 is coupled to a first terminal of a resistor 445. The first terminal of the resistor 445 is also coupled to node 470. The second terminal of the resistor 445 is coupled to ground.

In one embodiment, for example, the output driver 450 may include a transistor 452. The transistor 452 may be a HV MOSFET or any other type of transistor. A gate of the transistor 452 is electrically coupled to the drain of transistor 438 of the driving stage circuit 430. The drain of the transistor 452 is electrically coupled to the I/O node. The source of the transistor 452 is electrically coupled ground.

During normal operation, when no ESD event is occurring, there should be no output from the driving stage circuit 430. Because the high-pass filter 420 blocks non-ESD events, the voltage at the I/O gate is not coupled to the gate of transistor 432 in the driving stage circuit 430 through the capacitor 422 in the high-pass filter 420. Transistors 424, 434, 438, and 444 would be off (i.e., not conducting) and transistors 436 and 443 would be on (i.e., conducting).

During an ESD event, the I/O node is coupled to transistor 432 through the capacitor 422. The gate-source voltage across the gate and source of transistor 432 turns the transistor 432 on. Transistor 434 also turns on since the potential at node 460 caused by voltage the ESD event on the I/O node causes the gate-source voltage of transistor 434 to exceed a threshold voltage of transistor 434. Transistors 432 and 434 pulls node 470 high (i.e., node 470 is coupled to the I/O node through transistors 432 and 434). Once node 470 is pulled high, transistors 444 latches node 460 to ground, increasing the voltage bias at node 470. Accordingly, the gate-source voltage of transistor 438 will exceed a threshold voltage of transistor 438, turning transistor 438 on. When transistor 438 is turned on, the transistor 438 couples the output of the ESD circuit (i.e., node 480) to ground, protecting the output driver 450. In the embodiment illustrated in FIG. 4, when the node 480 is electrically coupled to ground, the gate of transistor 452 of the output driver 450 is coupled to ground. Thus, the gate and the source of the transistor 452 are coupled to ground during an ESD event causing the gate-source voltage of the transistor 452 to be substantially zero, ensuring that the transistor 452 remains off during the ESD event. By ensuring that the transistor 452 remains off during the ESD event, the ESD circuit 400 prevents any potential ESD energy from discharging through the output driver 450.

As the voltage on the I/O node subsides (because the ESD event is over), the voltage stored in the capacitor 422 begins to dissipate through the transistor 424 (or a resistor in another embodiment), dropping the voltage at the gate of transistor 432 in the driving circuit. When the gate-source voltage of transistor 432 drops below the threshold voltage of transistor 432, the potential at node 470 then begins to dissipate through transistor 436 to ground and through resistor 445 to ground, causing the gate-source voltage of transistor 438 to drop below the threshold voltage of transistor 438, thus turning off transistor 438 and turning off the driving stage circuit. Furthermore, the dissipation of the potential voltage at node 470 turns transistor 444 off, allowing transistor 436 to return to a low impedance state, turning the driving stage circuit off. Node 460 will thus start to charge through the step-down circuit 410 which causes transistor 443 to turn on. The turn-on state of transistor 443 ensures a low voltage potential on the gate of the transistor 432, which provides a better noise immunity for the transistor 432. Accordingly, in this embodiment, the latch circuit 440 increases the rate at which the ESD circuit turns on, protecting the output driver 450, and increases the rate at which the ESD circuit turns off, returning the IC 100 to normal operation relative to the embodiment illustrated in FIG. 3. In one embodiment, for example, the latch circuit 440 can return the integrated circuit to normal operation within one-hundred nanoseconds of an ESD event. Furthermore, the one or more zener diodes 442 of the latch circuit 440 ensure that the coupling at node 470 does not damage the gate oxide of transistors 432.

FIG. 5 is a flow diagram illustrating a method 500 for operating a ESD circuit, in accordance with an embodiment. The method begins when a high-pass filter, such as those illustrated in FIGS. 2-4, detects an ESD event. (Step 510). The high-pass filter then sends a signal to a driving stage circuit indicating that an ESD event is occurring, for example, by coupling the gate subject to the ESD event to the driving stage circuit through a capacitor as illustrated in FIGS. 3-4. (Step 520). The driving stage circuit, upon receiving the signal from the high-pass circuit, shunts an input of an output driver to ground. (Step 530). In one embodiment, for example, a latch circuit coupled to the driving stage circuit, such as the latch circuit illustrated in FIG. 4, increases a voltage bias in a node of the driving stage circuit to increase the rate at which the driving stage circuit shunts an input of an output driver to ground. (Step 540). As seen in FIG. 4, for example, the transistor 444 latches the node 460 to ground to turn off transistor 436 to increase the voltage at node 470. After the ESD event is over, the high-pass filter ceases sending a signal to the driving stage circuit. (Step 550). As illustrated in FIGS. 3-4, for example, the charge stored on a capacitor may be dissipated through a transistor or a resistor to ground to essentially decouple the driving circuit from the gate which subjected to the ESD event. According, the high-pass filter may cease sending the signal when a voltage across the capacitor has fallen below a threshold voltage of the transistor 432 illustrated in FIG. 4. The driving stage circuit, upon ceasing to receive the signal from the high-pass circuit, ceases shunting the input of the output driver to ground, thus returning the integrated circuit to normal operation. (Step 560). In one embodiment, for example, a latch circuit may also dissipate a voltage at a node (e.g., node 470 illustrated in FIG. 4) to increase the rate at which the integrated circuit returns to normal operation. (Step 570).

In one embodiment, for example, an integrated circuit is provided. The integrated circuit may include, but is not limited to, a first node configured to receive an input or an output, a second node configured to be coupled to ground, an output driver electrically coupled to the first node and the second node, and a ESD circuit electrically coupled to the first node, the second node, and the output driver. The ESD circuit may include, but is not limited to a high-pass filter configured to detect an electrostatic discharge event at the first node, a driving stage circuit electrically coupled to the high-pass filter and the output driver, the driving stage circuit configured to receive a signal from the high-pass filter when the high-pass filter detects the electrostatic discharge event and further configured to shunt an input of the output driver to the second node in response to the signal from the high-pass filter, and a step-down circuit electrically coupled to the driving stage circuit and configured to bias the driving stage circuit. The high-pass filter may include, but is not limited to a first capacitor including a first terminal and a second terminal, wherein the first terminal of the first capacitor is coupled to the first node, and a first transistor including a gate, a source, and a drain, wherein a source of the first transistor is coupled to the second terminal of the first capacitor and the gate and the drain of the first transistor are coupled to the second node. In another embodiment, for example, the high-pass filter may include, but is not limited to a first capacitor including a first terminal and a second terminal, wherein the first terminal of the first capacitor is coupled to the first node, and a first resistor including a first terminal and a second terminal, wherein the first terminal of the first resistor is coupled to the second terminal of the first capacitor and the second terminal of the first resistor is coupled to the second node. The driving stage circuit may include, but is not limited to a first transistor including a gate, a source, and a drain, wherein the drain of the first transistor is coupled to the first node and the gate of the first transistor is coupled to the high-pass filter, a second transistor including a gate, a source, and a drain, wherein the source of the second transistor is coupled to the source of the first transistor and the gate of the second transistor is coupled to the step-down circuit, a third transistor including a gate, a source, and a drain, wherein the drain of the third transistor is coupled to the drain of the second transistor, the gate of the third transistor is coupled to the step-down circuit, and the source of the third transistor is coupled to the second node, and a fourth transistor including a gate, a source, and a drain, wherein the gate of the fourth transistor is coupled to the drain of the second transistor, the source of the fourth transistor is coupled to the second node and the drain of the fourth transistor is coupled to the output driver. The ESD circuit may further include a latch circuit, the latch circuit including, but not limited to a fifth transistor including a gate, a source, and a drain, wherein the gate of the fifth transistor is coupled to the gate of the third transistor, a source of the fifth transistor is coupled to the second node and a drain of the fifth transistor is coupled to a gate of the first transistor, a sixth transistor including a gate, a source, and a drain, wherein the gate of the sixth transistor is coupled to the gate of the fourth transistor, the source of the sixth transistor is coupled to the second node and the drain of the sixth transistor is coupled to the step-down circuit, and a resistor including a first terminal and a second terminal, wherein the first terminal of the resistor is coupled to the second node and the second terminal of the resistor is coupled to the gate of the fourth transistor. The latch circuit may further include a zener diode having a first terminal and a second terminal, wherein the first terminal of the zener diode is coupled to the second node and the second terminal of the zener diode is coupled to the gate of the first transistor, and a capacitor including a first terminal and a second terminal, wherein a first terminal of the capacitor is coupled to the second node and a second terminal of the capacitor is coupled to the step-down circuit. The high-pass filter may include, but is not limited to a first capacitor including a first terminal and a second terminal, wherein the first terminal of the first capacitor is coupled to the first node and the second terminal of the first capacitor is coupled to the gate of the first transistor, and a fifth transistor including a gate, a source, and a drain, wherein a source of the transistor is coupled to the second terminal of the first capacitor and the gate and the drain of the fifth transistor are coupled to the second node. In one embodiment, for example, the step-down circuit may be a voltage divider.

In another exemplary embodiment, for example, a ESD circuit configured to be coupled to a first node, a second node, and an output driver is provided. The ESD circuit may include, but is not limited to a high-pass filter configured to detect an electrostatic discharge event at the first node, a driving stage circuit electrically coupled to the high-pass filter and the output driver, the driving stage circuit configured to receive a signal from the high-pass filter when the high-pass filter detects the electrostatic discharge event and further configured to shunt an input of the output driver to the second node in response to the signal from the high-pass filter, and a step-down circuit electrically coupled to the driving stage circuit and configured to bias the driving stage circuit. In one embodiment, for example, the high-pass filter includes, but is not limited to a first capacitor including a first terminal and a second terminal, wherein the first terminal of the first capacitor is coupled to the first node and a first transistor including a gate, a source, and a drain, wherein a source of the first transistor is coupled to the second terminal of the first capacitor and the gate and the drain of the first transistor are coupled to the second node. In another embodiment, for example, the high-pass filter includes, but is not limited to a first capacitor including a first terminal and a second terminal, wherein the first terminal of the first capacitor is coupled to the first node, and a first resistor including a first terminal and a second terminal, wherein the first terminal of the first resistor is coupled to the second terminal of the first capacitor and the second terminal of the first resistor is coupled to the second node. The driving stage circuit may include, but is not limited to a first transistor including a gate, a source, and a drain, wherein the drain of the first transistor is coupled to the first node and the gate of the first transistor is coupled to the high-pass filter, a second transistor including a gate, a source, and a drain, wherein the source of the second transistor is coupled to the source of the first transistor and the gate of the second transistor is coupled to the step-down circuit, a third transistor including a gate, a source, and a drain, wherein the drain of the third transistor is coupled to the drain of the second transistor, the gate of the third transistor is coupled to the step-down circuit, and the source of the third transistor is coupled to the second node, and a fourth transistor including a gate, a source, and a drain, wherein the gate of the fourth transistor is coupled to the drain of the second transistor, the source of the fourth transistor is coupled to the second node and the drain of the fourth transistor is coupled to the output driver. The ESD circuit may further include a latch circuit, the latch circuit including, but not limited to a fifth transistor including a gate, a source, and a drain, wherein the gate of the fifth transistor is coupled to the gate of the third transistor, a source of the fifth transistor is coupled to the second node and a drain of the fifth transistor is coupled to a gate of the first transistor, a sixth transistor including a gate, a source, and a drain, wherein the gate of the sixth transistor is coupled to the gate of the fourth transistor, the source of the sixth transistor is coupled to the second node and the drain of the sixth transistor is coupled to the step-down circuit, and a resistor including a first terminal and a second terminal, wherein the first terminal of the resistor is coupled to the second node and the second terminal of the resistor is coupled to the gate of the fourth transistor. In one embodiment, for example, the latch circuit further includes a zener diode having a first terminal and a second terminal, wherein the first terminal of the zener diode is coupled to the second node and the second terminal of the zener diode is coupled to the gate of the first transistor, and a first capacitor including a first terminal and a second terminal, wherein a first terminal of the first capacitor is coupled to the second node and a second terminal of the first capacitor is coupled to the step-down circuit. The high-pass filter may include, but is not limited to a second capacitor including a first terminal and a second terminal, wherein the first terminal of the second capacitor is coupled to the first node and the second terminal of the second capacitor is coupled to the gate of the first transistor, and a seventh transistor including a gate, a source, and a drain, wherein a source of the seventh transistor is coupled to the second terminal of the second capacitor and the gate and the drain of the seventh transistor are coupled to the second node. In one embodiment, for example, the step-down circuit includes, but is not limited to a voltage divider.

In another exemplary embodiment, for example, a method for shunting an input of an output driver to ground is provided. The method may include, but is not limited to detecting, via a high-pass filter, an electrostatic discharge event, sending, by the high-pass filter, a signal indicating the electrostatic discharge event to a driving stage circuit, and shunting, by the driving stage circuit, the input of the output driver to ground. The method may further include increase a voltage bias in the driving stage circuit to increase rate at which the driving stage circuit shunts the input of the output driver to ground. The method may further include ceasing, by the high-pass filter, the signal indicating the electrostatic discharge event to the driving stage circuit when the electrostatic discharge event is over, and ceasing, by the driving stage circuit, shunting the input of the output driver to ground when the high-pass filter ceases sending the signal. The method may further include dissipating the voltage bias in the driving stage circuit to increase rate at which the driving stage circuit ceases shunting the input of the output driver.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. An integrated circuit, comprising:
  a first node configured to receive an input or an output;
  a second node configured to be coupled to a reference voltage;
  an output driver electrically coupled to the first node and the second node; and
  a electrostatic discharge circuit electrically coupled to the first node, the second node, and the output driver, the electrostatic discharge circuit comprising:
    a high-pass filter configured to detect an electrostatic discharge event at the first node;
    a driving stage circuit electrically coupled to the high-pass filter and the output driver, the driving stage circuit configured to receive a signal from the high-pass filter when the high-pass filter detects the electrostatic discharge event and further configured to shunt an input of the output driver to the second node in response to the signal from the high-pass filter, the driving stage circuit comprising:
      a first transistor including a gate, a source, and a drain, wherein the drain of the first transistor is coupled to the first node and the gate of the first transistor is coupled to the high-pass filter;
      a second transistor including a gate, a source, and a drain, wherein the source of the second transistor is coupled to the source of the first transistor and the gate of the second transistor is coupled to the step-down circuit;
      a third transistor including a gate, a source, and a drain, wherein the drain of the third transistor is coupled to the drain of the second transistor, the gate of the third transistor is coupled to the step-down circuit, and the source of the third transistor is coupled to the second node; and
      a fourth transistor including a gate, a source, and a drain, wherein the gate of the fourth transistor is coupled to the drain of the second transistor, the source of the fourth transistor is coupled to the second node and the drain of the fourth transistor is coupled to the output driver;

a latch circuit electrically coupled to the driving stage circuit, the latch circuit configured to increase a rate the driving stage circuit shunts the output driver to the second node in response to the signal from the high-pass filter, the latch circuit comprising:

a fifth transistor including a gate, a source, and a drain, wherein the gate of the fifth transistor is coupled to the gate of the third transistor, a source of the fifth transistor is coupled to the second node and a drain of the fifth transistor is coupled to a gate of the first transistor;

a sixth transistor including a gate, a source, and a drain, wherein the gate of the sixth transistor is coupled to the gate of the fourth transistor, the source of the sixth transistor is coupled to the second node and the drain of the sixth transistor is coupled to the step-down circuit; and a first resistor including a first terminal and a second terminal, wherein the first terminal of the resistor is coupled to the second node and the second terminal of the first resistor is coupled to the gate of the fourth transistor; and a step-down circuit electrically coupled to the driving stage circuit and configured to bias the driving stage circuit.

2. The integrated circuit of claim 1, wherein the high-pass filter comprises:

a first capacitor including a first terminal and a second terminal, wherein the first terminal of the first capacitor is coupled to the first node; and a seventh transistor including a gate, a source, and a drain, wherein a source of the seventh transistor is coupled to the second terminal of the first capacitor and the gate and the drain of the seventh transistor are coupled to the second node.

3. The integrated circuit of claim 1, wherein the high-pass filter comprises:

a first capacitor including a first terminal and a second terminal, wherein the first terminal of the first capacitor is coupled to the first node; and a second resistor including a first terminal and a second terminal, wherein the first terminal of the second resistor is coupled to the second terminal of the first capacitor and the second terminal of the second resistor is coupled to the second node.

4. The integrated circuit of claim 1, wherein the latch circuit further comprises:

a zener diode having a first terminal and a second terminal, wherein the first terminal of the zener diode is coupled to the second node and the second terminal of the zener diode is coupled to the gate of the first transistor; and a capacitor including a first terminal and a second terminal, wherein a first terminal of the capacitor is coupled to the second node and a second terminal of the capacitor is coupled to the step-down circuit.

5. The integrated circuit of claim 1, wherein the high-pass filter comprises:

a first capacitor including a first terminal and a second terminal, wherein the first terminal of the first capacitor is coupled to the first node and the second terminal of the first capacitor is coupled to the gate of the first transistor; and a seventh transistor including a gate, a source, and a drain, wherein a source of the seventh transistor is coupled to the second terminal of the first capacitor and the gate and the drain of the seventh transistor are coupled to the second node.

6. The integrated circuit of claim 1, wherein the step-down circuit comprises a voltage divider.

7. An electrostatic discharge circuit configured to be coupled to a first node, a second node, and an output driver, the electrostatic discharge circuit comprising:

a high-pass filter configured to detect an electrostatic discharge event at the first node;

a driving stage circuit electrically coupled to the high-pass filter and the output driver, the driving stage circuit configured to receive a signal from the high-pass filter when the high-pass filter detects the electrostatic discharge event and further configured to shunt an input of the output driver to the second node in response to the signal from the high-pass filter, the driving stage circuit comprising:

a first transistor including a gate, a source, and a drain, wherein the drain of the first transistor is coupled to the first node and the gate of the first transistor is coupled to the high-pass filter;

a second transistor including a gate, a source, and a drain, wherein the source of the second transistor is coupled to the source of the first transistor and the gate of the second transistor is coupled to the step-down circuit;

a third transistor including a gate, a source, and a drain, wherein the drain of the third transistor is coupled to the drain of the second transistor, the gate of the third transistor is coupled to the step-down circuit, and the source of the third transistor is coupled to the second node; and a fourth transistor including a gate, a source, and a drain, wherein the gate of the fourth transistor is coupled to the drain of the second transistor, the source of the fourth transistor is coupled to the second node and the drain of the fourth transistor is coupled to the output driver;

a latch circuit electrically coupled to the driving stage circuit, the latch circuit configured to increase a rate the driving stage circuit shunts the output driver to the second node in response to the signal from the high-pass filter, the latch circuit comprising:

a fifth transistor including a gate, a source, and a drain, wherein the gate of the fifth transistor is coupled to the gate of the third transistor, a source of the fifth transistor is coupled to the second node and a drain of the fifth transistor is coupled to a gate of the first transistor;

a sixth transistor including a gate, a source, and a drain, wherein the gate of the sixth transistor is coupled to the gate of the fourth transistor, the source of the sixth transistor is coupled to the second node and the drain of the sixth transistor is coupled to the step-down circuit; and a first resistor including a first terminal and a second terminal, wherein the first terminal of the first resistor is coupled to the second node and the second terminal of the first resistor is coupled to the gate of the fourth transistor; and a step-down circuit electrically coupled to the driving stage circuit and configured to bias the driving stage circuit.

8. The electrostatic discharge circuit of claim 7, wherein the high-pass filter comprises:

a first capacitor including a first terminal and a second terminal, wherein the first terminal of the first capacitor is coupled to the first node; and a seventh transistor including a gate, a source, and a drain, wherein a source of the first seventh transistor is coupled to the second terminal of the first capacitor and the gate and the drain of the seventh transistor are coupled to the second node.

9. The electrostatic discharge circuit of claim 7, wherein the high-pass filter comprises:

a first capacitor including a first terminal and a second terminal, wherein the first terminal of the first capacitor is coupled to the first node; and a second resistor including a first terminal and a second terminal, wherein the first terminal of the second resistor is coupled to the second terminal of the first capacitor and the second terminal of the second resistor is coupled to the second node.

10. The electrostatic discharge circuit of claim 7, wherein the latch circuit further comprises:

a zener diode having a first terminal and a second terminal, wherein the first terminal of the zener diode is coupled to the second node and the second terminal of the zener diode is coupled to the gate of the first transistor; and a first capacitor including a first terminal and a second terminal, wherein a first terminal of the first capacitor is coupled to the second node and a second terminal of the first capacitor is coupled to the step-down circuit.

11. The electrostatic discharge circuit of claim 10, wherein the high-pass filter comprises:

a second capacitor including a first terminal and a second terminal, wherein the first terminal of the second capacitor is coupled to the first node and the second terminal of the second capacitor is coupled to the gate of the first transistor; and a seventh transistor including a gate, a source, and a drain, wherein a source of the seventh transistor is coupled to the second terminal of the second capacitor and the gate and the drain of the seventh transistor are coupled to the second node.

12. The electrostatic discharge circuit of claim 7, wherein the step-down circuit comprises a voltage divider.

13. A method for shunting an input of an output driver to ground, comprising:

detecting, via a high-pass filter, an electrostatic discharge event;

sending, by the high-pass filter, a signal indicating the electrostatic discharge event to a driving stage circuit, the driving stage circuit comprising:

a first transistor including a gate, a source, and a drain, wherein the drain of the first transistor is coupled to the first node and the gate of the first transistor is coupled to the high-pass filter;

a second transistor including a gate, a source, and a drain, wherein the source of the second transistor is coupled to the source of the first transistor and the gate of the second transistor is coupled to the step-down circuit;

a third transistor including a gate, a source, and a drain, wherein the drain of the third transistor is coupled to the drain of the second transistor, the gate of the third transistor is coupled to the step-down circuit, and the source of the third transistor is coupled to the second node; and a fourth transistor including a gate, a source, and a drain, wherein the gate of the fourth transistor is coupled to the drain of the second transistor, the source of the fourth transistor is coupled to the second node and the drain of the fourth transistor is coupled to the output driver;

shunting, by the driving stage circuit, the input of the output driver to ground; and, increasing, by a latch circuit, a rate of the shunting by the driving stage circuit by latching an input to the driving stage circuit to ground, the latch circuit comprising:

a fifth transistor including a gate, a source, and a drain, wherein the gate of the fifth transistor is coupled to the gate of the third transistor, a source of the fifth transistor is coupled to the second node and a drain of the fifth transistor is coupled to a gate of the first transistor;

a sixth transistor including a gate, a source, and a drain, wherein the gate of the sixth transistor is coupled to the gate of the fourth transistor, the source of the sixth transistor is coupled to the second node and the drain of the sixth transistor is coupled to the step-down circuit; and a first resistor including a first terminal and a second terminal, wherein the first terminal of the first resistor is coupled to the second node and the second terminal of the first resistor is coupled to the gate of the fourth transistor.

14. The method of claim 13, further comprising increase a voltage bias in the driving stage circuit to increase a rate at which the driving stage circuit shunts the input of the output driver to ground.

15. The method of claim 14, further comprising:

ceasing, by the high-pass filter, the signal indicating the electrostatic discharge event to the driving stage circuit when the electrostatic discharge event is over; and ceasing, by the driving stage circuit, shunting the input of the output driver to ground when the high-pass filter ceases sending the signal.

16. The method of claim 15, further comprising dissipating the voltage bias in the driving stage circuit to increase a rate at which the driving stage circuit ceases shunting the input of the output driver.

* * * * *